(12) United States Patent
Lee

(10) Patent No.: US 6,975,155 B2
(45) Date of Patent: Dec. 13, 2005

(54) LEVEL SHIFTING CIRCUIT AND METHOD

(75) Inventor: Ho-Young Lee, Sungnam (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/776,961

(22) Filed: Feb. 11, 2004

(65) Prior Publication Data

US 2005/0012537 A1 Jan. 20, 2005

(30) Foreign Application Priority Data

Jul. 14, 2003 (KR) .................... 10-2003-0048062

(51) Int. Cl.[7] .............................................. H03L 5/00
(52) U.S. Cl. ........................................ 327/333; 326/68
(58) Field of Search ................................ 327/333, 112, 327/108, 427, 581, 203, 208, 215, 218; 326/68, 80, 81; 365/189.11

(56) References Cited

U.S. PATENT DOCUMENTS

| | | | | |
|---|---|---|---|---|
| 6,043,699 | A | * | 3/2000 | Shimizu ...................... 327/333 |
| 6,556,061 | B1 | | 4/2003 | Chen et al. .................. 327/333 |
| 6,774,695 | B2 | * | 8/2004 | Hayashi et al. ............. 327/333 |
| 2002/0050849 | A1 | * | 5/2002 | Hayashi et al. ............. 327/333 |
| 2003/0146781 | A1 | | 8/2003 | Chang et al. ............... 327/333 |

FOREIGN PATENT DOCUMENTS

| | | |
|---|---|---|
| KR | 2001-0028858 | 4/2001 |
| KR | 2003-0002229 | 1/2003 |

* cited by examiner

*Primary Examiner*—Long Nguyen
(74) *Attorney, Agent, or Firm*—Mills & Onello LLP (57) ABSTRACT

Described is a level shifting device for high-frequency operation. The level shifting device includes first through fifth transistors. The first transistor has its gate connected to an input signal, its source connected to the voltage node at an lower voltage value, and its drain connected to an output signal. The second transistor has its gate connected to an inverted version of the input signal, its source connected to the voltage node at the lower voltage value, and its drain connected to an inverted version of the output signal. The third transistor has its gate connected to the drain of the second transistor and its drain connected to the drain of the first transistor. The fourth transistor has its gate connected to the drain of the first transistor, its drain connected to the drain of the second transistor, and its source connected to the voltage supply at an first upper voltage value. The fifth transistor has its gate connected to the input signal, its source connected to the voltage supply at the first upper voltage value, and its drain connected to the source of the third transistor. The input signal swings between a second upper voltage value and the lower voltage value and the output signal swings between the first upper voltage value and the lower voltage value.

24 Claims, 12 Drawing Sheets

| | | 10MHz | 100MHz | 500MHz | 1GHz |
|---|---|---|---|---|---|
| CONVENTIONAL STRUCTURE | SWING RANGE | 100% | 100% | 89% | 4% |
| | DUTY RATIO | 49.5:50.5 | 46.5:53.5 | 18.3:81.7 | - |
| | CURRENT (VDDH) | 10uA | 85uA | 380uA | 250uA |
| PRESENT INVENTION | SWING RANGE | 100% | 100% | 100% | 100% |
| | DUTY RATIO | 49.9:50.1 | 49.0:51.0 | 48.5:52.0 | 51.2:48.8 |
| | CURRENT (VDDH) | 16uA | 174uA | 737uA | 1089uA |

LEVEL SHIFTING CIRCUIT AND METHOD

RELATED APPLICATION

The present application relies for priority on Korean patent application No. 2003-0048062, filed on Jul. 14, 2003, the contents of which are incorporated herein in their entirety by reference.

FIELD OF THE INVENTION

The present invention relates to a high-speed level shifting circuit and method.

BACKGROUND OF THE INVENTION

When connecting logic circuits having different power source voltages, it is necessary to shift the logic level of an output signal from one logic circuit to the level of the logic circuit that receives the output signal. Typically, this operation is performed by a level shifting circuit.

Figure 1:
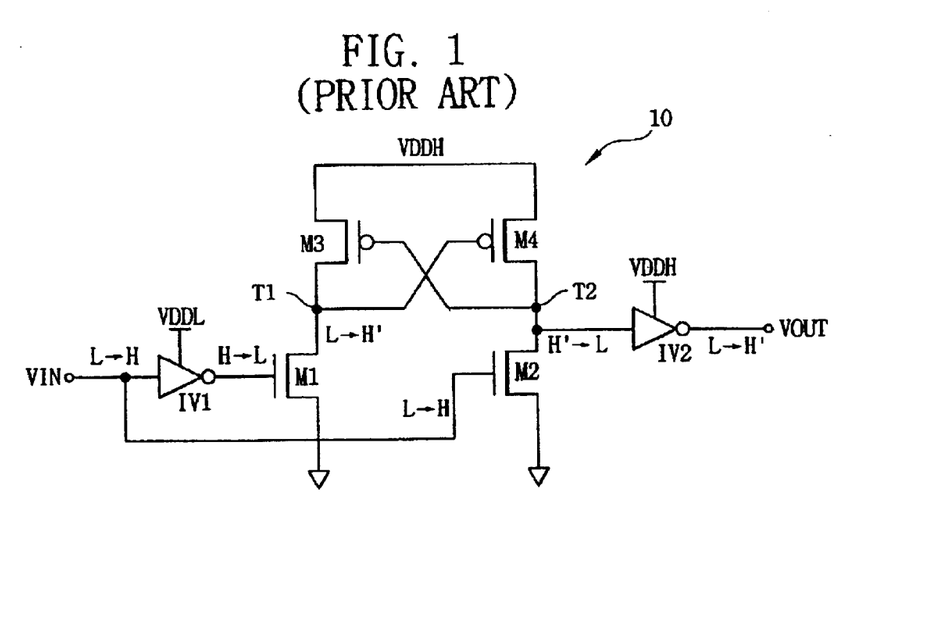
FIG. 1 is a schematic diagram of a conventional level shifting circuit.

FIG. 1 is a schematic diagram of a conventional level shifting circuit 10. The conventional level shifter 10 includes an inverter IV1, which operates from a power source voltage VDDL of an input side of the circuit. The circuit 10 also includes four transistors M1, M2, M3 and M4, which operate from a power source voltage VDDH of an output side of the circuit . . . . The transistors M3 and M4 are p-channel MOS (PMOS) transistors, and the transistors M1 and M2 are n-channel MOS (NMOS) transistors. Transistors M1 and M2 are driven by an input signal VIN, the high level of which is VDDL, and the operation voltage of M1 and M2 is VDDH. When the level of the input signal is converted, a large delay is introduced into the converted signal, which has a detrimental effect on the output side circuit. For this reason, the conventional level shifter cannot be used as an interface between high-speed logic circuits that operate at different power source voltages.

Figure 2:
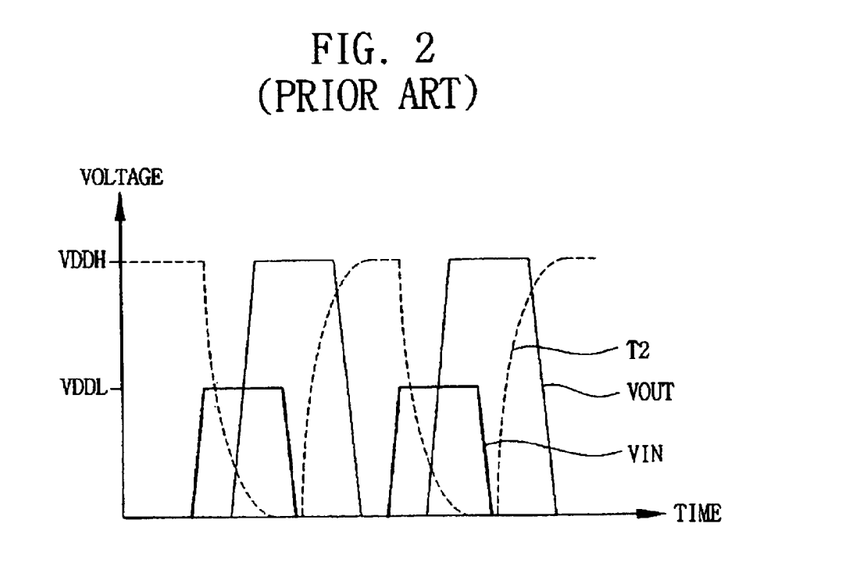
FIG. 2 is a timing diagram illustrating waveforms in the level shifting circuit of FIG. 1.

FIG. 2 is a timing diagram illustrating waveforms for the input voltage VIN and the output voltage VOUT of the conventional level shifting circuit 10 of FIG. 1. FIG. 2 also illustrates a voltage waveform of node T2 of the circuit 10. As illustrated in the schematic diagram of FIG. 1, when the input voltage transitions from a low voltage L to a high voltage H, the output of inverter IV1 applied to the gate of M1 transitions from H to L. The gate input of M2 also transitions from L to H. The output of transistor M1 at node T1 transitions from L to a second high voltage H'. The output of M2 at node T2 transitions from H' to L, and the output of inverter IV2 applied as the output voltage VOUT transitions from L to H'.

With regard to the input transistor pair M1 and M2, the maximum voltage of the pair is VDDL, which is comparatively lower than VDDH. As a result, the initial saturation current is limited. Hence, latching speed is limited. The discharge path is through M2. Therefore, the operation of the circuit is delayed. FIG. 2 illustrates the time delay between the input voltage VIN and the output voltage VOUT. As a result of this delay, high-speed operation of the device is limited. The following equation defines the current of M2.

$$I_{M2} = \frac{\mu_N C_{OX}}{2} \left(\frac{W}{L}\right)_{M2} (VDDL - V_{THN})^2$$

where $\mu_N$ is carrier mobility, $C_{OX}$ is gate capacitance, $V_{THN}$ is threshold voltage, W is channel width and L is channel length.

With regard to the PMOS cross-coupled pair M3 and M4, since node T2 is charged by M3 and M4, the delay time is longer than that of a CMOS cross-coupled pair. Also, the load capacitances of nodes T1 and T2 are different. As a result, rising and falling times of the signals are different. Therefore, as shown in FIG. 2, the duty cycle of the waveforms are distorted.

Figure 3:
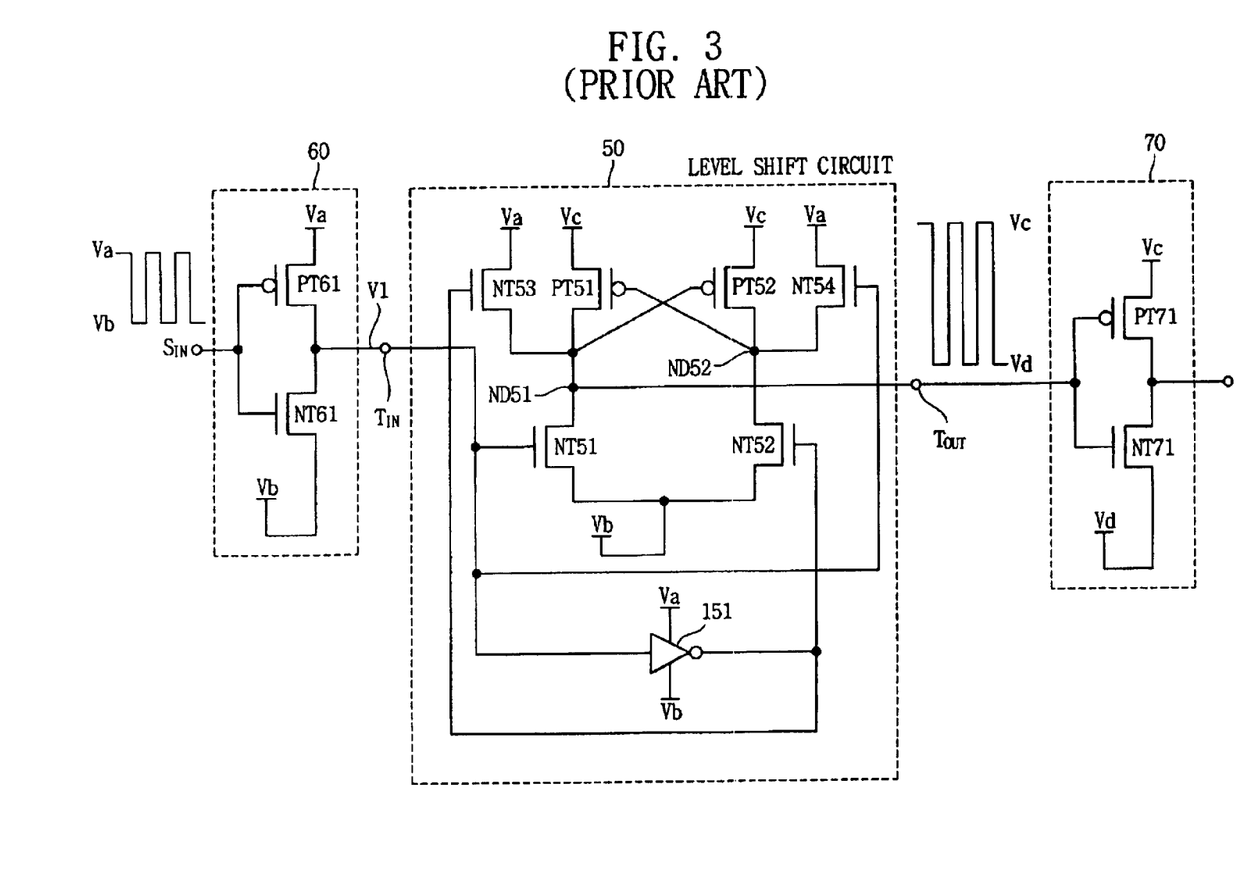
FIG. 3 is a schematic diagram of a level shifting circuit in accordance with the prior art.

One prior art level shifting circuit is disclosed in U.S. Pat. No. 6,043,699, the contents of which are incorporated herein in their entirety by reference. FIG. 3 contains a schematic diagram of the level shifting circuit of the '699 patent. Referring to FIG. 3, when a signal set to a voltage H(Va), analogous to VDDL, is input at terminal Tin, transistors NT51 and NT54 are in an on state. As a result of the on state of NT54, the potential at the gate of PT51 rises slightly. Also, since NT51 is in the on state, the potential at the gate of PT52 falls, and the potential at its drain rises. At this time, the potential at the gate of PT51 rises further, which lowers the potential at the output terminal Tout. Due to the function of NT54, which operates at the same time as NT51, high-speed operation is realized.

SUMMARY OF THE INVENTION

In one aspect, the invention is directed to a level shifting device. The device of the invention includes first through fifth transistors. The first transistor has its gate connected to an input signal, its source connected to a voltage node at a lower voltage value, and its drain connected to an output signal. The second transistor has its gate connected to an inverted version of the input signal, its source connected to the voltage node at the lower voltage value, and its drain connected to an inverted version of the output signal. The third transistor has its gate connected to the drain of the second transistor and its drain connected to the drain of the first transistor. The fourth transistor has its gate connected to the drain of the first transistor, its drain connected to the drain of the second transistor, and its source connected to a voltage supply at a first upper voltage value. The fifth transistor has its gate connected to the input signal, its source connected to the voltage supply at the first upper voltage value and its drain connected to the source of the third transistor. The input signal swings between a second upper voltage value and the lower voltage value, and the output signal swings between the first upper voltage value and the lower voltage value.

In one embodiment, the first transistor is a NMOS transistor, the second transistor is a NMOS transistor, the third transistor is a PMOS transistor, the fourth transistor is a PMOS transistor, and the fifth transistor is a PMOS transistor.

The circuit of the invention can further include a sixth transistor connected between the fourth transistor and the voltage supply at the first upper voltage value, the inverted version of the input signal being applied to the gate of the sixth transistor. In one embodiment, the sixth transistor is a PMOS transistor, the first transistor is a NMOS transistor, the second transistor is a NMOS transistor, the third transistor is a PMOS transistor, the fourth transistor is a PMOS transistor, and the fifth transistor is a PMOS transistor. In one embodiment, the lower voltage value is ground level. In one embodiment, a seventh transistor is connected in parallel with the third transistor between the fifth transistor and the first transistor, the inverted version of the input signal being applied to the gate of the seventh transistor. In one embodiment, the seventh transistor is a NMOS transistor, the first transistor is a NMOS transistor, the second transistor is a NMOS transistor, the third transistor is a PMOS transistor, the fourth transistor is a PMOS transistor, the fifth transistor is a PMOS transistor, and the sixth transistor is a PMOS transistor. In one embodiment, an eighth transistor is connected in parallel with the fourth transistor between the sixth transistor and the second transistor, the input signal being applied to the gate of the eighth transistor. In one embodiment, the eighth transistor is a NMOS transistor, the first transistor is a NMOS transistor, the second transistor is a NMOS transistor, the third transistor is a PMOS transistor, the fourth transistor is a PMOS transistor, the fifth transistor is a PMOS transistor, the sixth transistor is a transistor, and the seventh transistor is a NMOS transistor.

In one embodiment, a sixth transistor is connected in parallel with the third transistor between the fifth transistor and the first transistor, the inverted version of the input signal being applied to the gate of the sixth transistor. In one embodiment, the sixth transistor is a NMOS transistor, the first transistor is a NMOS transistor, the second transistor is a NMOS transistors, the third transistor is a PMOS transistor, the fourth transistor is a PMOS transistor, and the fifth transistor is a PMOS transistor. In one embodiment, a seventh transistor is connected in parallel with the fourth transistor between the second transistor and the voltage supply at the first upper voltage value, the input signal being applied to the gate of the seventh transistor. In one embodiment, the seventh transistor is a NMOS transistor, the first transistor is a NMOS transistor, the second transistor is a NMOS transistor, the third transistor is a PMOS transistor, the fourth transistor is a PMOS transistor, the fifth transistor is a PMOS, and the sixth transistor is a NMOS transistor.

In another aspect, the invention is directed to a level shifting device which includes first through fifth transistors and a latch circuit. The first transistor has its gate connected to an input signal, its source connected to a voltage node at a lower voltage value, and its drain connected to an output signal. The second transistor has its gate connected to an inverted version of the input signal, its source connected to the voltage node at the lower voltage value, and its drain connected to an inverted version of the output signal. The third transistor has its gate connected to the drain of the second transistor and its drain connected to the drain of the first transistor. The fourth transistor has its gate connected to the drain of the first transistor, its drain connected to the drain of the second transistor, and its source connected to a voltage supply at a first upper voltage value. The fifth transistor has its gate connected to the input signal, its source connected to the voltage supply at the first upper voltage value and its drain connected to the source of the third transistor. The latch circuit receives the output signal and the inverted version of the output signal. The input signal swings between a second upper voltage value and the lower voltage value and the output signal swings between the first upper voltage value and the lower voltage value In one embodiment, the first transistor is a NMOS transistor, the second transistor is a NMOS transistor, the third transistor is a PMOS transistor, the fourth transistor is a PMOS transistor, and the fifth transistor is a PMOS transistor.

In one embodiment, a sixth transistor is connected between the fourth transistor and the voltage supply at the first upper voltage value, the inverted version of the input signal being applied to the gate of the sixth transistor. In one embodiment, the sixth transistor is a PMOS transistor, the first transistor is a NMOS transistor, the second transistor is a NMOS transistor, the third transistor is a PMOS transistor, the fourth transistor is a PMOS transistor, and the fifth transistor is a PMOS transistor. In one embodiment, the lower voltage value is ground level. In one embodiment, a seventh transistor is connected in parallel with the third transistor between the fifth transistor and the first transistor, the inverted version of the input signal being applied to the gate of the seventh transistor. In one embodiment, the seventh transistor is a NMOS transistor, the first transistor is a NMOS transistor, the second transistor is a NMOS transistor, the third transistor is a PMOS transistor, the fourth transistor is a PMOS transistor, the fifth transistor is a PMOS transistor, and the sixth transistor is a PMOS transistor. In one embodiment, an eighth transistor is connected in parallel the fourth transistor between the sixth transistor and the second transistor, the input signal being applied to the gate of the eighth transistor. In one embodiment, the eighth transistor is a NMOS transistor, the first transistor is a NMOS transistor, the second transistor is a NMOS transistor, the third transistor is a PMOS transistor, the fourth transistor is a PMOS transistor, the fifth transistor is a PMOS transistor, the sixth transistor is a PMOS transistor, and the seventh transistor is a NMOS transistor.

In one embodiment, a sixth transistor is connected in parallel with third transistors between the fifth transistor and the first transistor, the inverted version of the input signal being applied to the gate of the sixth transistor. In one embodiment, the sixth transistor is a NMOS transistor, the first transistor is a NMOS transistor, the second transistor is a NMOS transistor, the third transistor is a PMOS transistor, the fourth transistor is a PMOS transistor, and the fifth transistor is a PMOS transistor. In one embodiment, a seventh transistor is connected in parallel with the fourth transistor between the second transistor and the voltage supply at the first upper voltage value, the input signal being applied to the gate of the seventh transistor. In one embodiment, the seventh transistor is a NMOS transistor, the first transistor is a NMOS transistor, the second transistor is a NMOS transistor, the third transistor is a PMOS transistor, the fourth transistor is a PMOS transistor, the fifth transistor is a PMOS, and the sixth transistor is a NMOS transistor.

In one embodiment, the latch circuit comprises a CMOS transistor configuration.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS OF THE INVENTION

Figure 4:
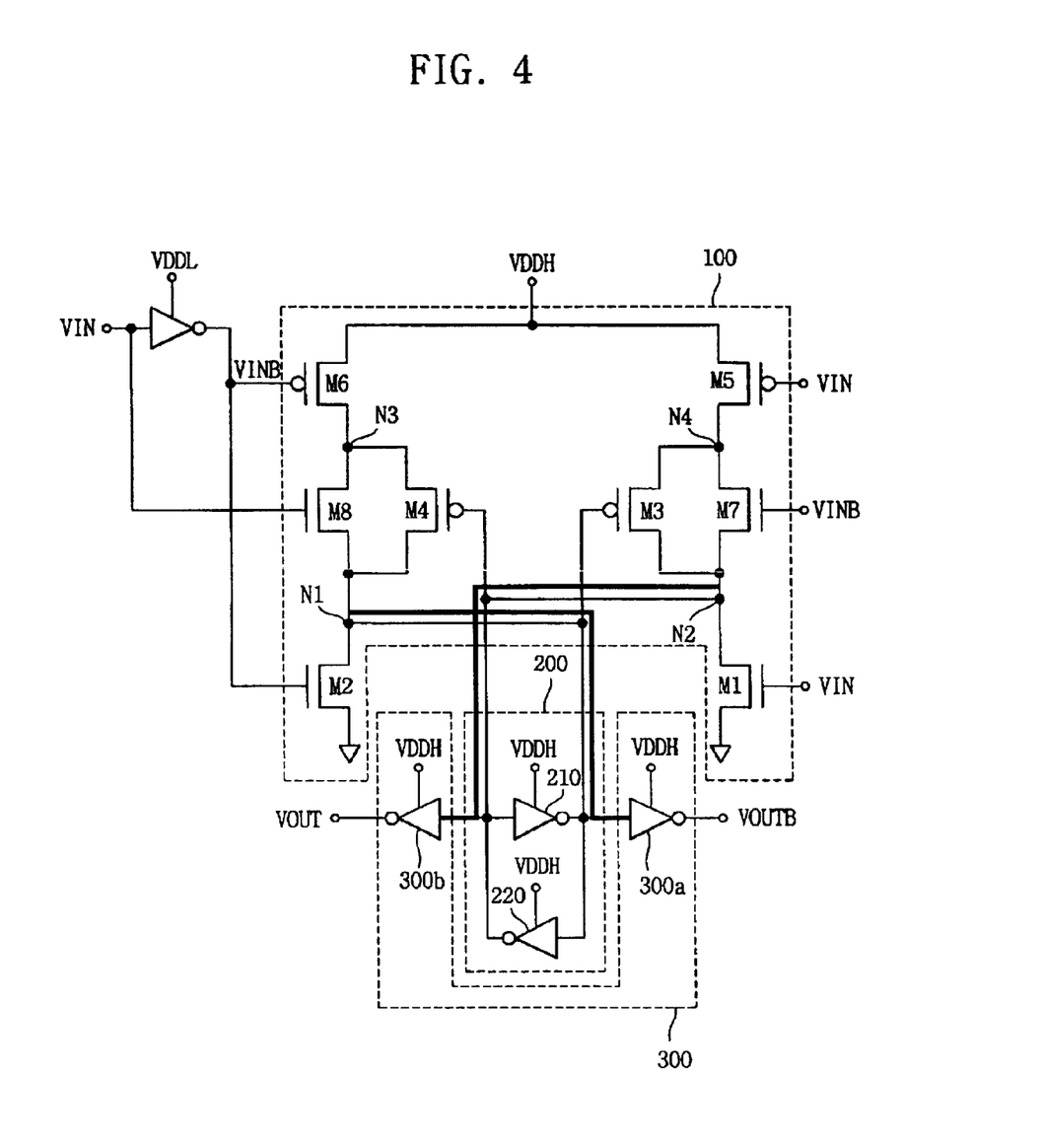
FIG. 4 contains a detailed schematic diagram of an embodiment of a level shifting circuit in accordance with the present invention.

FIG. 4 contains a detailed schematic diagram of an embodiment of a level shifting circuit in accordance with the present invention. As shown in FIG. 4, the input signals VIN and VINB are received by an input buffer 100, and the output signals VOUT and VOUTB are output by the output buffer 300. The latch circuit 200 is connected between the input buffer 100 and an output buffer 300. The darkened lines in FIG. 4 illustrate the configuration of the circuit in which the latch circuit 200 is omitted.

The input buffer 100 includes transistors M1 through M8. The input voltage range is between ground (GND) and VDDL. The output voltage range is between GND and VDDH. The latch circuit 200 includes a pair of inverters 210 and 220 in a CMOS cross-coupled pair configuration. The use of a CMOS inverter pair speeds up operation of the circuit and facilitates high-speed operation. The output buffer 300 includes a pair of inverters 300a and 300b. The inverters of the output buffer 300 provide equal rise and fall times and, therefore, result in a symmetric output waveform. It should be noted that some delay can be avoided by eliminating the latch circuit 200 from the circuit, as illustrated by the bold connection lines in FIG. 4. This configuration minimizes delay time by using a direct output.

Figure 5A:
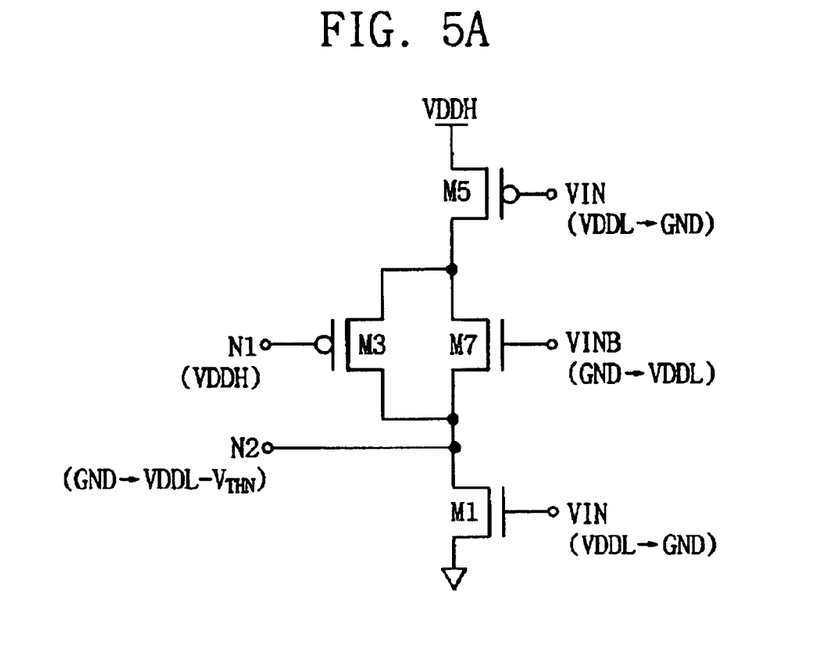
FIGS. 5A through 5D contain partial detailed schematic block diagrams of portions of the circuit of FIG. 4.
Figure 5B:
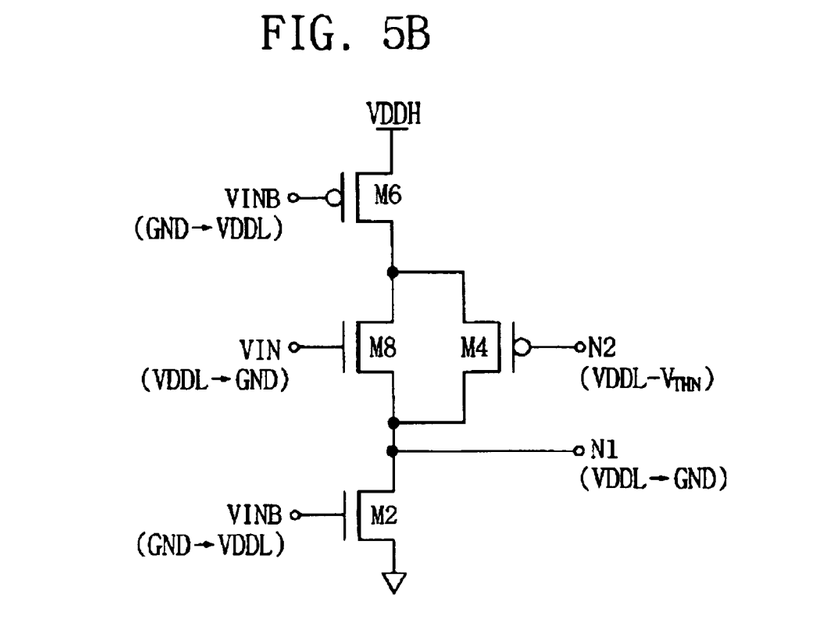

Operation of the circuit of FIG. 4. will now be described in detail in connection with FIGS. 5A through 5D, which are partial detailed schematic diagrams of portions of the circuit of FIG. 4 during various stages of operation. FIG. 5A is a detailed schematic diagram of the right side portion of the input buffer 100 as illustrated in FIG. 4. As shown, the right side input buffer includes transistors M1, M3, M5, and M7. FIG. 5B is a detailed schematic diagram of the left side portion of the input buffer 100 as illustrated in FIG. 4. As shown, the left side input buffer includes transistors M2, M4, M6, and M8. In an exemplary initial state of operation, the input signal VIN is equal to VDDL. The inverted input signal VINB is equal to GND. The voltage at node N1 is equal to VDDH, and the voltage at node N2 is GND. The output voltage VOUT is equal to VDDH, and the inverted output signal VOUTB is equal to GND.

When the state of the input signal VIN undergoes a transition from VDDL to GND, the inverted input signal VINB transitions from GND to VDDL. In the right side input buffer, transistor M1 turns off; M5 turns on; M7 turns on; and M3 turns off. The voltage at node N2 transitions from GND to VDDL-$V_{THN}$. In the left side input buffer, transistor M2 turns on; M6 turns on; M8 turns off; and M4 turns on. The voltage at node N1 transitions from VDDH to GND, noting that the discharge current of M1 is larger than the charge current of M6 and M4.

Figure 5C:
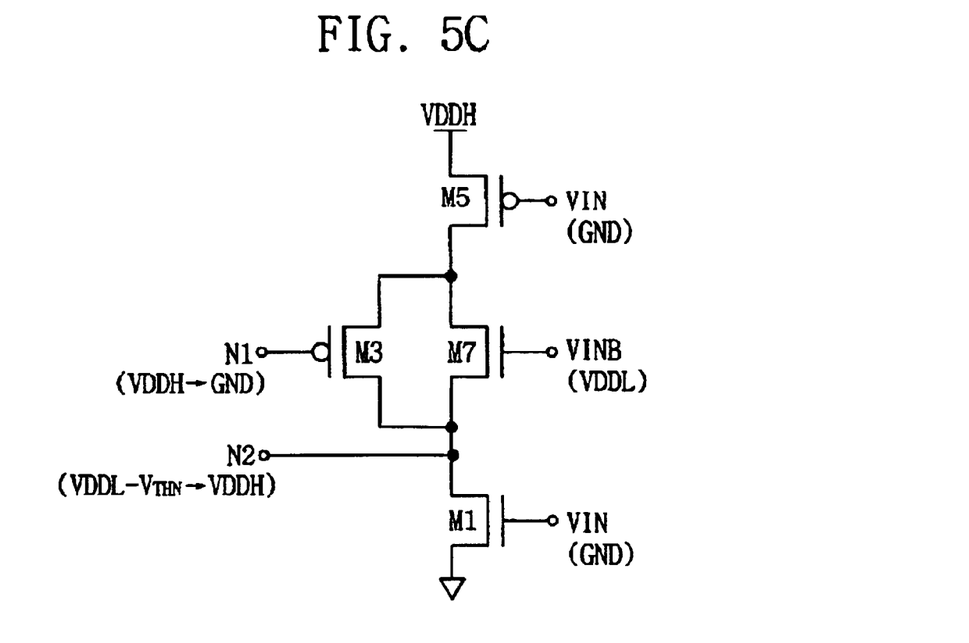
Figure 5D:
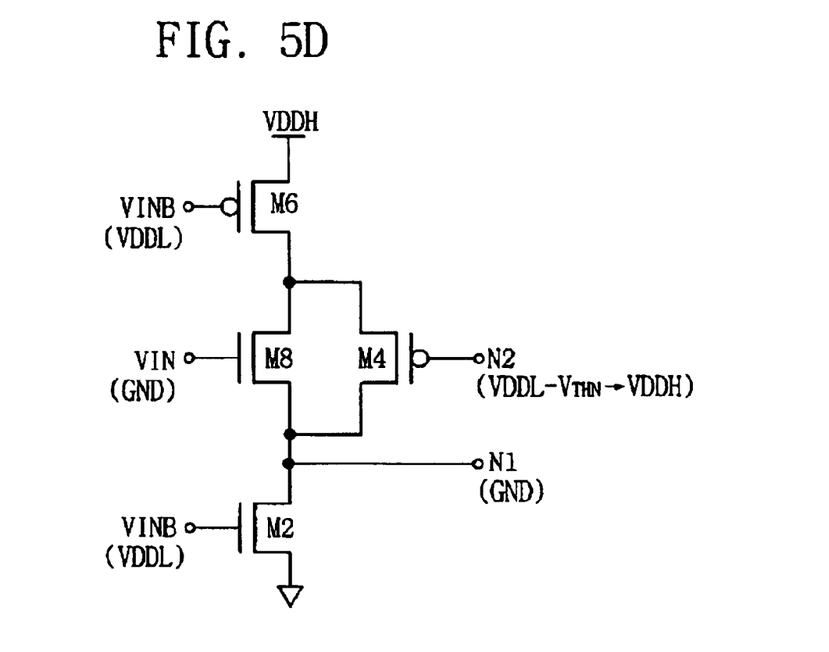

FIGS. 5C and 5D illustrate the right side and left side, respectively, of the input buffer after the transition has taken place. In the right side input buffer, if the potential at N1 is smaller than VDDH-$V_{THP}$, then M3 is turned on. As a result, the potential at N2 rises to VDDH. In the left side input buffer, as a result of the rising potential at N2, the decrease in current in M4 and the decrease in potential at node N1 are fast. The latch circuit 200 can increase the transition speed, such that N1 reaches GND and N2 reach VDDH very quickly.

When the transition is complete, in the right side of the input buffer, transistor M1 is turned off, such that there is no static current path. In the left side of the input buffer, transistors M4 and M8 are turned off, such that there is no static current path. As a result of this configuration, there is no static current.

Figure 6A:
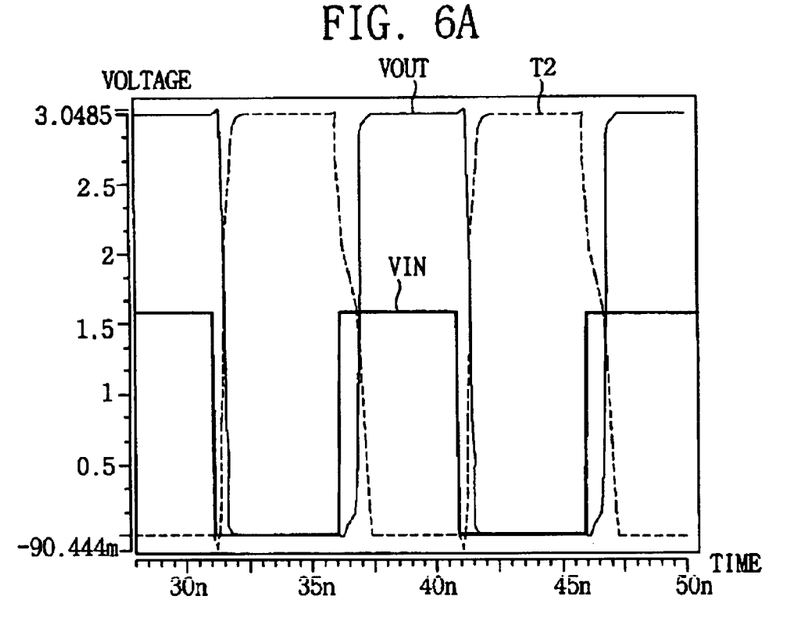
FIGS. 6A through 6C are waveform diagrams illustrating simulation results for a conventional level shifting circuit as shown in FIG. 1 for operational frequencies of 100 MHz, 500 MHz and 1 GHz, respectively.
Figure 6B:
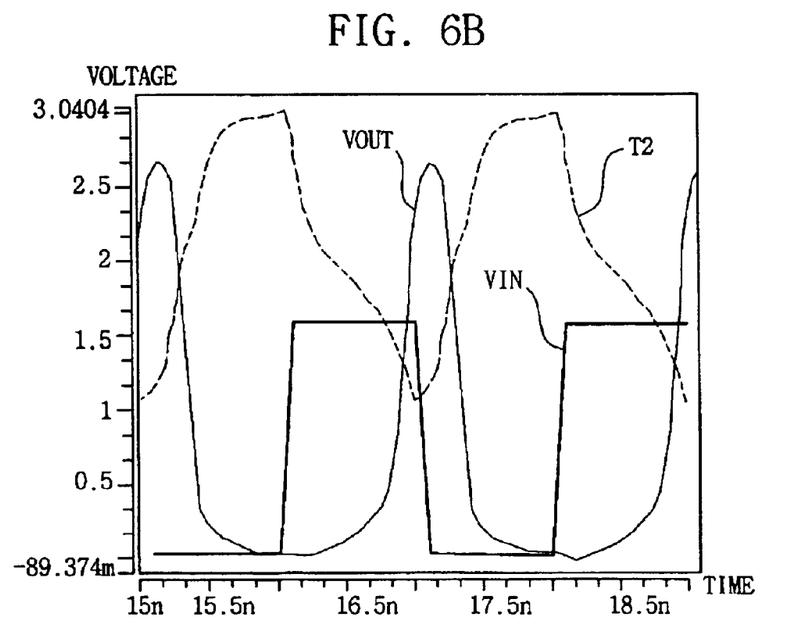
Figure 6C:
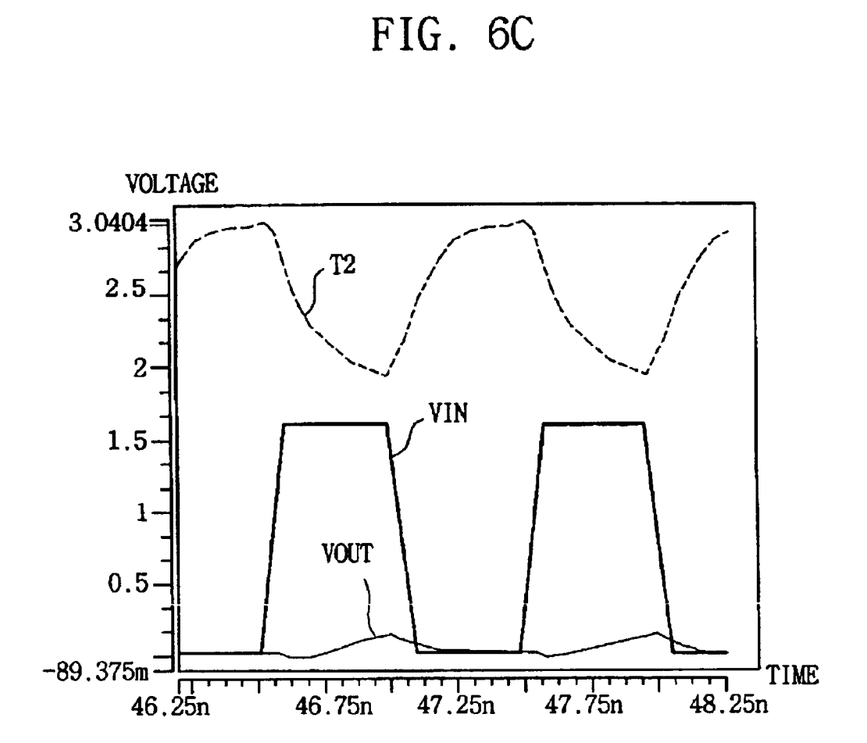
Figure 7A:
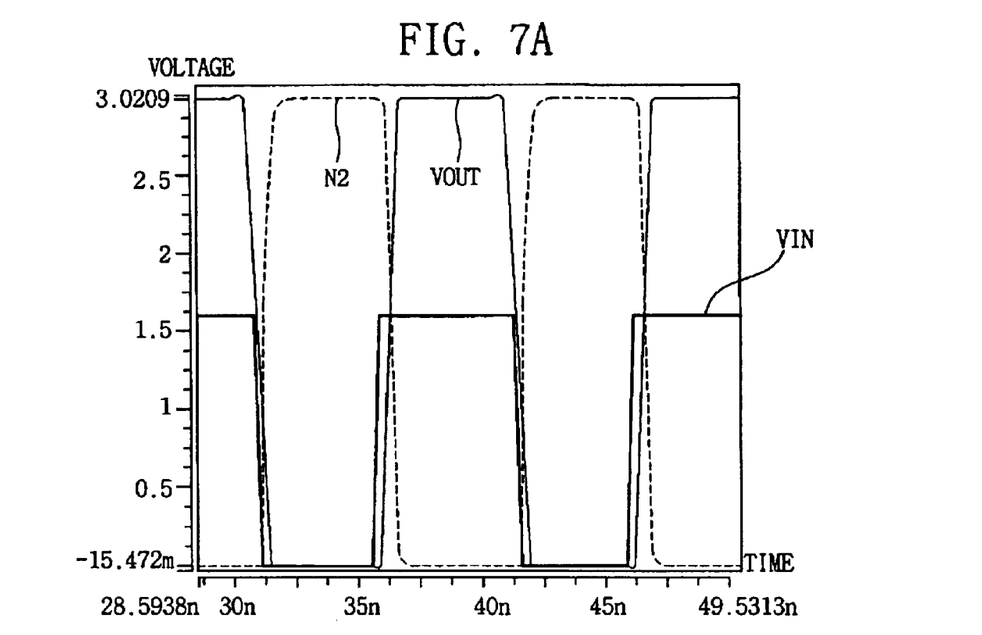
FIGS. 7A through 7C are waveform diagrams illustrating simulation results for a level shifting circuit in accordance with the invention, such as the circuit shown in FIG. 4, for operational frequencies of 100 MHz, 500 MHz and 1 GHz, respectively.
Figure 7B:
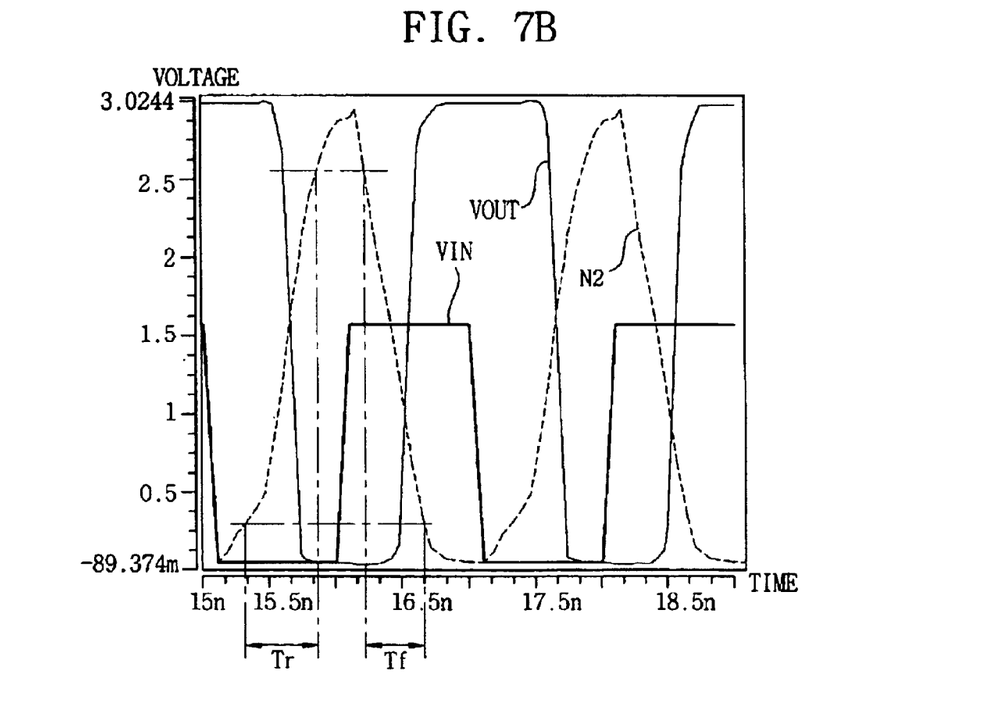
Figure 7C:
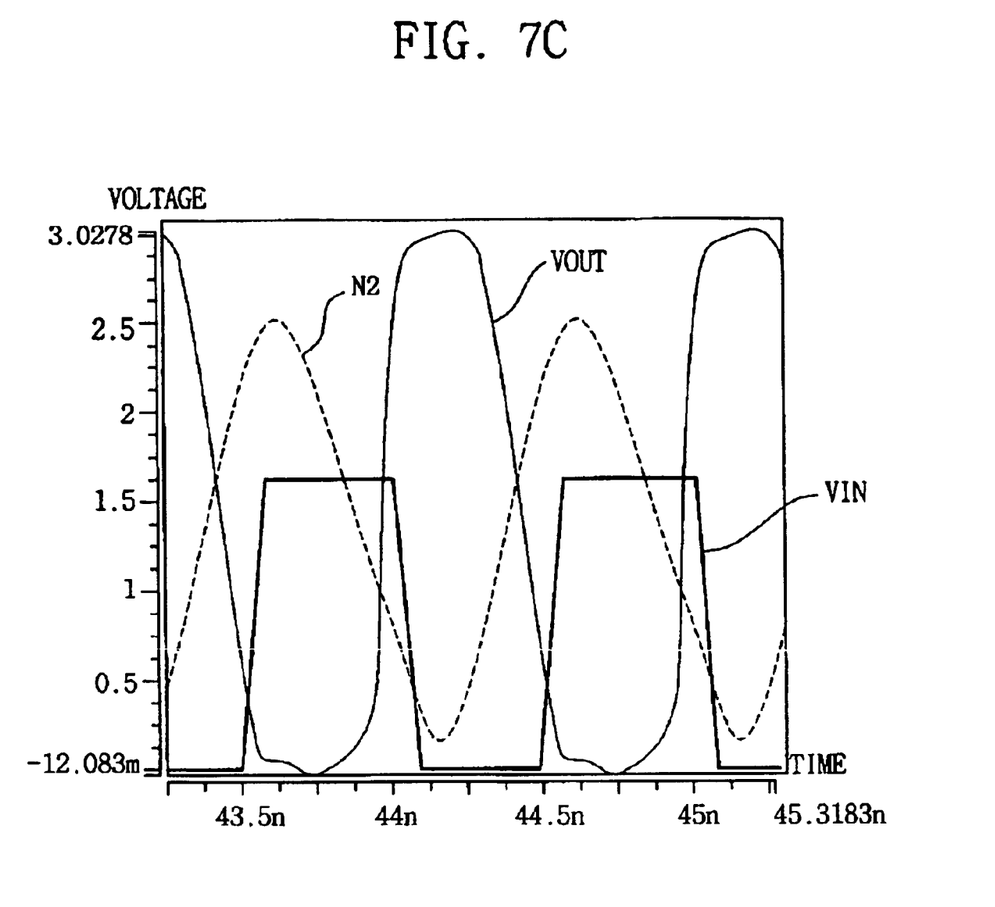
Figure 8:
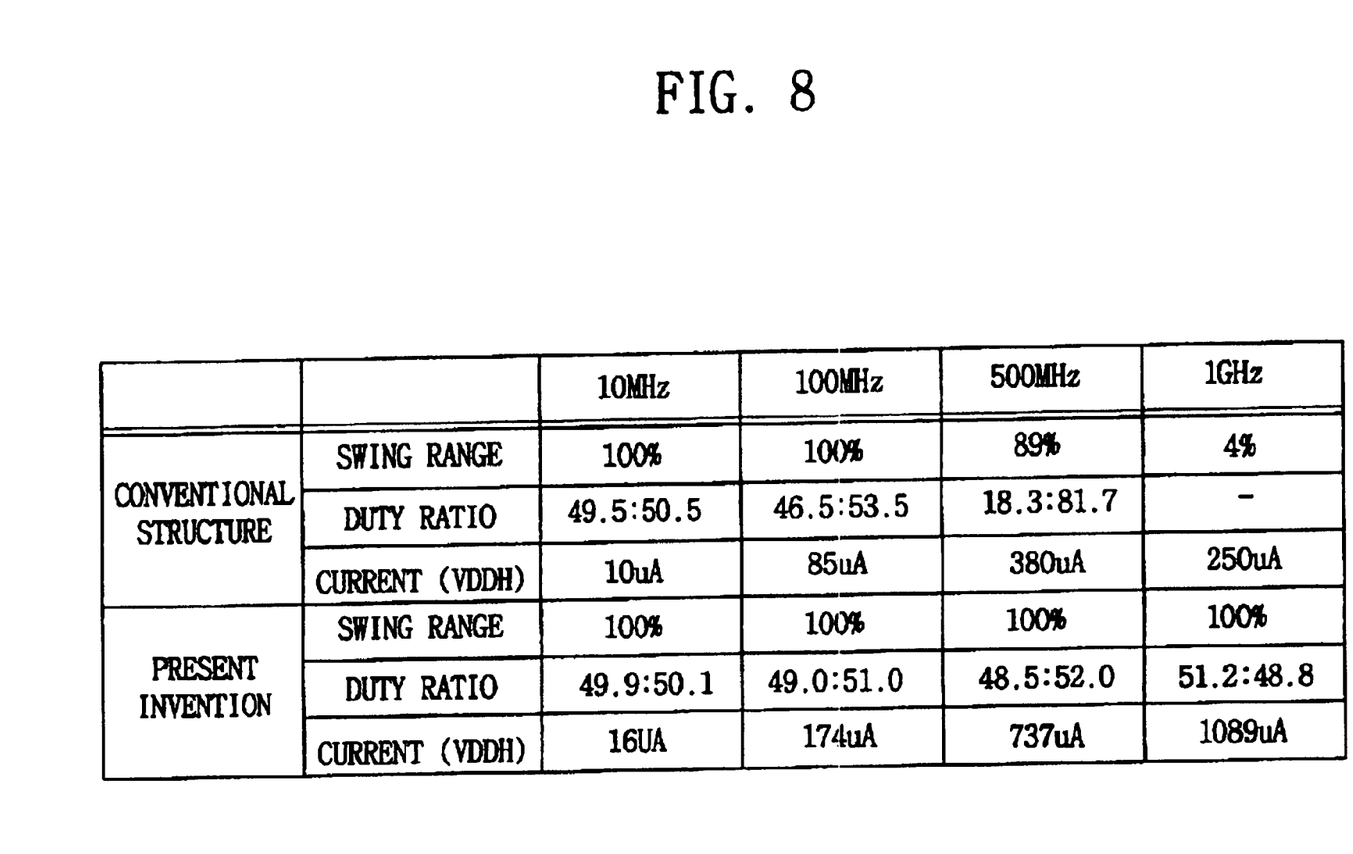
FIG. 8 is a table containing simulation results for the conventional circuit of FIG. 1 and the circuit of the invention shown in FIG. 4 for operational frequencies of 10 MHz, 100 MHz, 500 MHz and 1 GHz.

FIGS. 6A through 6C are waveform diagrams illustrating simulation results for a conventional level shifting circuit as shown in FIG. 1 for operational frequencies of 100 MHz, 500 MHz and 1 GHz, respectively. FIGS. 7A through 7C are waveform diagrams illustrating simulation results for a level shifting circuit in accordance with the invention, such as the circuit shown in FIG. 4, for operational frequencies of 100 MHz, 500 MHz and 1 GHz, respectively. FIGS. 6A through 6C and 7A through 7C, respectively, illustrate the difference in performance over frequency between the conventional circuit of FIG. 1 and the circuit of the invention of FIG. 4. FIG. 8 is a table containing simulation results for the conventional circuit of FIG. 1 and the circuit of the invention shown in FIG. 4 for operational frequencies of 10 MHz, 100 MHz, 500 MHz and 1 GHz.

As shown in FIGS. 6A through 6C, the circuit of the prior art exhibits acceptable performance at relatively low frequency, i.e., at 100 MHz. However, as the frequency increases, the performance of the circuit deteriorates to an unacceptable level. At 1 GHz, for example, as shown in FIG. 6C, the conventional circuit completely fails to produce a useful output waveform VOUT. The table of FIG. 8 also illustrates the unacceptable behavior of the conventional circuit at high frequency. At 500 MHz, for example, the swing range of the output waveform begins to drop. At 1 GHZ, the swing range of the output waveform is not useful. The duty ratio obtained in the conventional circuit also deteriorates as the frequency increases. Referring to FIGS. 7A through 7C, the circuit of the invention continues to produce good results even as the frequency increases to 1 GHz. Referring to the table of FIG. 8, the swing range and duty ratio of the output signal VOUT maintain acceptable levels even at the highest frequency.

Figure 9:
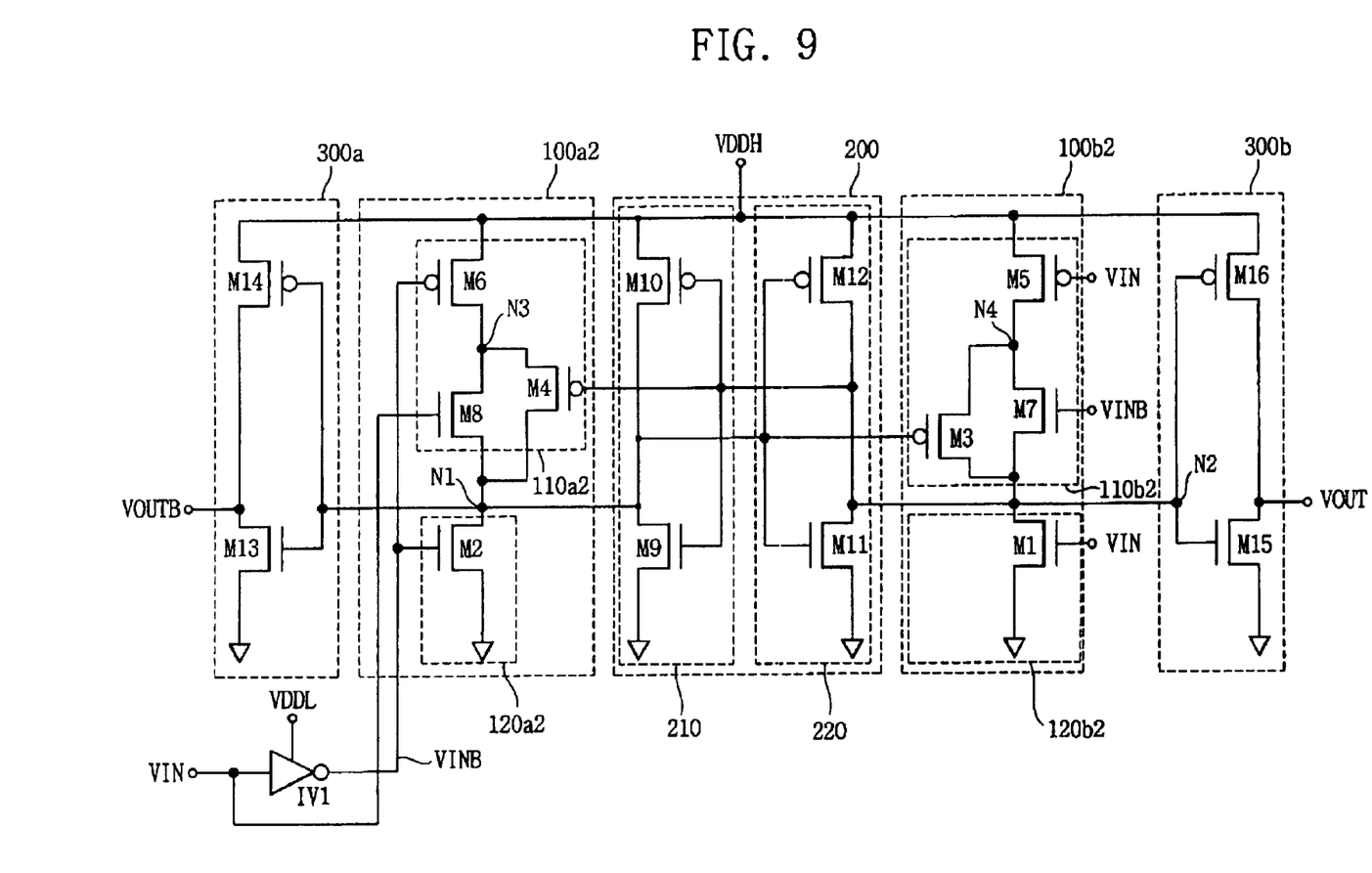
FIG. 9 is a more detailed schematic diagram of the circuit of the invention shown in FIG. 4.

FIG. 9 is a more detailed schematic diagram of the circuit of the invention shown in FIG. 4. In FIG. 9, the output buffer 300 is shown as including the inverters 300a and 300b. The inverter 300a includes transistors M13 and M14. The inverter 300b is shown as including transistors M15 and M16. The latch circuit 200 is shown as including inverter circuits 210 and 220. The inverter 210 is shown as including transistors M9 and M10. The inverter 220 is shown as including transistors M11 and M12. The input buffer circuit 100 includes portions 100a2 and 100b2. Circuit 100a2 includes transistor circuit 110a2, including transistors M4, M6, and M8, and transistor circuit 120a2, including transistor M2. Circuit 100b2 includes transistor circuit 110b2, including transistors M3, M5, and M7 and transistor circuit 120b2, including transistor M1.

To illustrate operation of the circuit of FIG. 9, a transition of states in the circuit will be described. In an initial state, VIN=GND, N2=VDDH, VOUT=GND, VINB=VDDL, N1=GND, and VOUTB=VDDH. In operation, VIN transitions from GND to VDDL, and VINB transitions from VDDL to GND. Transistors M1, M3, M5, M6 and M8 turn on, and M2, M4 and M7 turn off. The discharge current of M1 is larger than the charge current of M3–M5, so the voltage of N2 is reduced to GND. In this embodiment of the invention, M8 turns on faster than M4, and M8 provides an additional charge path to the N1 node. As a result, the voltage at N1 in this embodiment, rises faster than that of a conventional level shifter. That is, the level shifter of this embodiment operates at higher speed than a conventional level shifting circuit.

Figure 10:
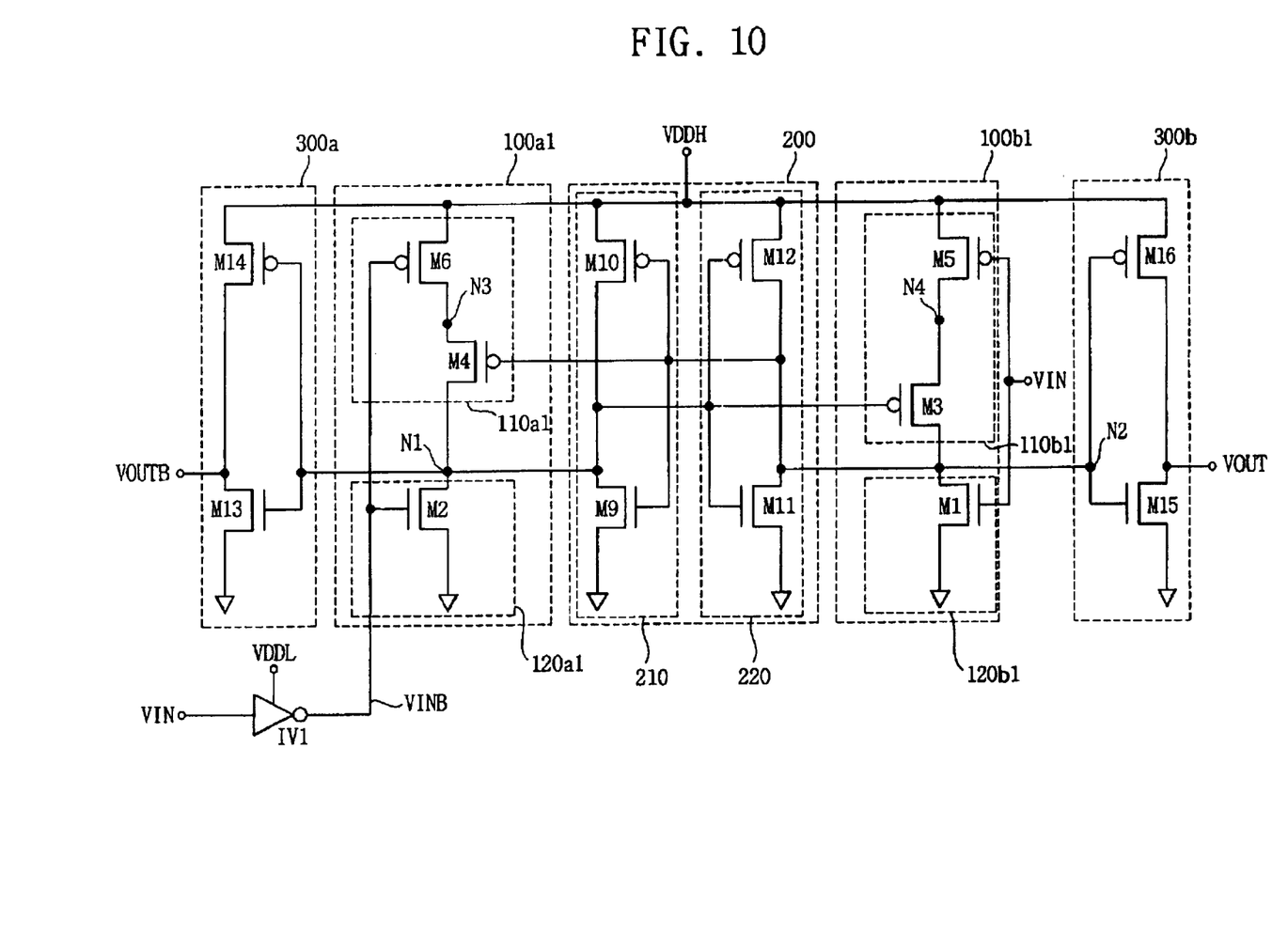
FIG. 10 is a detailed schematic diagram of a level shifting circuit in accordance with an alternative embodiment of the invention.

FIG. 10 is a detailed schematic diagram of a level shifting circuit in accordance with an alternative embodiment of the invention. The circuit of FIG. 10 is different from the circuit of FIG. 9 in that the circuit of FIG. 10 does not include the transistors M7 and M8.

To illustrate operation of the circuit of FIG. 10, a transition of states in the circuit will be described. In an initial state, the same conditions exist as existed in the initial state described above in connection with FIG. 9. That is, VIN=GND, N2=VDDH, VOUT=GND, VINB=VDDL, N1=GND, and VOUTB=VDDH. In operation, VIN transitions from GND to VDDL, and VINB transitions from VDDL to GND. Transistors M1, M3, M5 and M6 turn on, and M2 and M4 turn off. The discharge current of M1 is larger than the charge current of M3–M5, so the voltage of N2 is reduced to GND. In this embodiment of the invention, the operational voltage of M5 is VDDH, but the maximum VIN is VDDL, so the current of M5 is limited by VIN. As a result, the difference in discharge and charge current of the present embodiment is larger than that of the conventional level shifter. As a result, the discharge speed of the present invention is faster than that of the conventional level shifter.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A level shifting device, comprising:
   a first transistor having its gate connected to an input signal, its source connected to a voltage node at a lower voltage value, and its drain connected to an output signal;
   a second transistor having its gate connected to an inverted version of the input signal, its source connected to the voltage node at the lower voltage value, and its drain connected to an inverted version of the output signal;
   a third transistor having its gate connected to the drain of the second transistor, and its drain connected to the drain of the first transistor;
   a fourth transistor having its gate connected to the drain of the first transistor, its drain connected to the drain of the second transistor, and its source connected to a voltage supply at a first upper voltage value;
   a fifth transistor having its gate connected to the input signal, its source connected to the voltage supply at the first upper voltage value, and its drain connected to the source of the third transistor;
   a sixth transistor connected between the fourth transistor and the voltage supply at the first upper voltage value, the inverted version of the input signal being applied to the gate of the sixth transistor; and
   a seventh transistor connected in parallel with the third transistor between the fifth transistor and the first transistor, the inverted version of the input signal being applied to the gate of the seventh transistor;
   wherein the input signal swings between a second upper voltage value and the lower voltage value and the output signal swings between the first upper voltage value and the lower voltage value.

2. The level shifting device of claim 1, wherein the first transistor is a NMOS transistor, the second transistor is a NMOS transistor, the third transistor is a PMOS transistor, the fourth transistor is a PMOS transistor, and the fifth transistor is a PMOS transistor.

3. The level shifting device of claim 1, wherein the sixth transistor is a PMOS transistor, the first transistor is a NMOS transistor, the second transistor is a NMOS transistor, the third transistor is a PMOS transistor, the fourth transistor is a PMOS transistor, and the fifth transistor is a PMOS transistor.

4. The level shifting device of claim 1, wherein the lower voltage value is ground level.

5. The level shifting device of claim 1, wherein the seventh transistor is a NMOS transistor, the first transistor is a NMOS transistor, the second transistor is a NMOS transistor, the third transistor is a PMOS transistor, the fourth transistor is a PMOS transistor, the fifth transistor is a PMOS transistor, and the sixth transistor is a PMOS transistor.

6. The level shifting device of claim 1, further comprising an eighth transistor connected in parallel with the fourth transistor between the sixth transistor and the second transistor, the input signal being applied to the gate of the eighth transistor.

7. The level shifting device of claim 6, wherein the eighth transistor is a NMOS transistor, the first transistor is a NMOS transistor, the second transistor is a NMOS transistor, the third transistor is a PMOS transistor, the fourth transistor is a PMOS transistor, the fifth transistor is a PMOS transistor, the sixth transistor is a PMOS transistor, and the seventh transistor is a NMOS transistor.

8. A level shifting device, comprising:
   a first transistor having its gate connected to an input signal, its source connected to a voltage node at a lower voltage value, and its drain connected to an output signal;
   a second transistor having its gate connected to an inverted version of the input signal, its source connected to the voltage node at the lower voltage value, and its drain connected to an inverted version of the output signal;
   a third transistor having its gate connected to the drain of the second transistor, and its drain connected to the drain of the first transistor;
   a fourth transistor having its gate connected to the drain of the first transistor, its drain connected to the drain of the second transistor, and its source connected to a voltage supply at a first upper voltage value;
   a fifth transistor having its gate connected to the input signal, its source connected to the voltage supply at the first upper voltage value and its drain connected to the source of the third transistor;
   a sixth transistor connected between the fourth transistor and the voltage supply at the first upper voltage value, the inverted version of the input signal being applied to the gate of the sixth transistor;
   a seventh transistor connected in parallel with the third transistor between the fifth transistor and the first transistor, the inverted version of the input signal being applied to the gate of the seventh transistor; and
   a latch circuit receiving the output signal and the inverted version of the output signal, wherein the input signal swings between a second upper voltage value and the lower voltage value, and the output signal swings between the first upper voltage value and the lower voltage value.

9. The level shifting device of claim 8, wherein the first transistor is a NMOS transistor, the second transistor is a NMOS transistor, the third transistor is a PMOS transistor, the fourth transistor is a PMOS transistor, and the fifth transistor is a PMOS transistor.

10. The level shifting device of claim 8, wherein the sixth transistor is a PMOS transistor, the first transistor is a NMOS transistor, the second transistor is a NMOS transistor, the third transistor is a PMOS transistor, the fourth transistor is a PMOS transistor, and the fifth transistor is a PMOS transistor.

11. The level shifting device of claim 8, wherein the lower voltage value is ground level.

12. The level shifting device of claim 8, wherein the seventh transistor is a NMOS transistor, the first transistor is a NMOS transistor, the second transistor is a NMOS transistor, the third transistor is a PMOS transistor, the fourth transistor is a PMOS transistor, the fifth transistor is a PMOS transistor, and the sixth transistor is a PMOS transistor.

13. The level shifting device of claim 8, further comprising an eighth transistor connected in parallel with the fourth transistor between the sixth transistor and the second transistor, the input signal being applied to the gate of the eighth transistor.

14. The level shifting device of claim 13, wherein the eighth transistor is a NMOS transistor, the first transistor is a NMOS transistor, the second transistor is a NMOS transistor, the third transistor is a PMOS transistor, the fourth transistor is a PMOS transistor, the fifth transistor is a PMOS transistor, the sixth transistor is a PMOS transistor, and the seventh transistor is a NMOS transistor.

15. The level shifting device of claim 8, wherein the latch circuit comprises a CMOS transistor configuration.

16. A level shifting device, comprising:
   a first transistor having its gate connected to an input signal, its source connected to a voltage node at a lower voltage value, and its drain connected to an output signal;
   a second transistor having its gate connected to an inverted version of the input signal, its source connected to the voltage node at the lower voltage value, and its drain connected to an inverted version of the output signal;
   a third transistor having its gate connected to the drain of the second transistor, and its drain connected to the drain of the first transistor;
   a fourth transistor having its gate connected to the drain of the first transistor, its drain connected to the drain of the second transistor, and its source connected to a voltage supply at a first upper voltage value;
   a fifth transistor having its gate connected to the input signal, its source connected to the voltage supply at the first upper voltage value, and its drain connected to the source of the third transistor;
   a sixth transistor connected in parallel with the third transistor between the fifth transistor and the first transistor, the inverted version of the input signal being applied to the gate of the sixth transistor;
   wherein the input signal swings between a second upper voltage value and the lower voltage value and the output signal swings between the first upper voltage value and the lower voltage value.

17. The level shifting device of claim 16, wherein the sixth transistor is a NMOS transistor, the first transistor is a NMOS transistor, the second transistor is a NMOS transistor, the third transistor is a PMOS transistor, the fourth transistor is a PMOS transistor, and the fifth transistor is a PMOS transistor.

18. The level shifting device of claim 16, further comprising a seventh transistor connected in parallel with the fourth transistor between the second transistor and the voltage supply at the first upper voltage value, the input signal being applied to the gate of the seventh transistor.

19. The level shifting device of claim 18, wherein the seventh transistor is a NMOS transistor, the first transistor is a NMOS transistor, the second transistor is a NMOS transistor, the third transistor is a PMOS transistor, the fourth transistor is a PMOS transistor, the fifth transistor is a PMOS, and the sixth transistor is a NMOS transistor.

20. A level shifting device, comprising:
   a first transistor having its gate connected to an input signal, its source connected to a voltage node at a lower voltage value, and its drain connected to an output signal;
   a second transistor having its gate connected to an inverted version of the input signal, its source connected to the voltage node at the lower voltage value, and its drain connected to an inverted version of the output signal;
   a third transistor having its gate connected to the drain of the second transistor, and its drain connected to the drain of the first transistor;
   a fourth transistor having its gate connected to the drain of the first transistor, its drain connected to the drain of the second transistor, and its source connected to a voltage supply at a first upper voltage value;
   a fifth transistor having its gate connected to the input signal, its source connected to the voltage supply at the first upper voltage value and its drain connected to the source of the third transistor;
   a sixth transistor connected in parallel with the third transistor between the fifth transistor and the first transistor, the inverted version of the input signal being applied to the gate of the sixth transistor; and
   a latch circuit receiving the output signal and the inverted version of the output signal, wherein the input signal swings between a second upper voltage value and the lower voltage value, and the output signal swings between the first upper voltage value and the lower voltage value.

21. The level shifting device of claim 20, wherein the sixth transistor is a NMOS transistor, the first transistor is a NMOS transistor, the second transistor is a NMOS transistor, the third transistor is a PMOS transistor, the fourth transistor is a PMOS transistor, and the fifth transistor is a PMOS transistor.

22. The level shifting device of claim 20, further comprising a seventh transistor connected in parallel with the fourth transistor between the second transistor and the voltage supply at the first upper voltage value, the input signal being applied to the gate of the seventh transistor.

23. The level shifting device of claim 22, wherein the seventh transistor is a NMOS transistor, the first transistor is a NMOS transistor, the second transistor is a NMOS transistor, the third transistor is a PMOS transistor, the fourth transistor is a PMOS transistor, the fifth transistor is a PMOS, and the sixth transistor is a NMOS transistor.

24. The level shifting device of claim 20, wherein the latch circuit comprises a CMOS transistor configuration.

* * * * *